United States Patent
Ueno et al.

(10) Patent No.: US 8,295,317 B2
(45) Date of Patent: Oct. 23, 2012

(54) METHOD OF MAKING NITRIDE SEMICONDUCTOR LASER, METHOD OF MAKING EPITAXIAL WAFER, AND NITRIDE SEMICONDUCTOR LASER

(75) Inventors: Masaki Ueno, Itami (JP); Takashi Kyono, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/878,298

(22) Filed: Sep. 9, 2010

(65) Prior Publication Data

US 2011/0007763 A1     Jan. 13, 2011

Related U.S. Application Data

(62) Division of application No. 12/429,322, filed on Apr. 24, 2009, now Pat. No. 7,883,915.

(30) Foreign Application Priority Data

Apr. 25, 2008   (JP) .................................. 2008-115661

(51) Int. Cl.
*H01S 5/00*   (2006.01)
(52) U.S. Cl. ........................ 372/43.01; 372/39
(58) Field of Classification Search .................... 372/39, 372/43.01
See application file for complete search history.

(56) References Cited

U.S. PATENT DOCUMENTS

| | | |
|---|---|---|
| 6,838,706 B2 | 1/2005 | Watanabe et al. |
| 2004/0179566 A1* | 9/2004 | El-Bahar .................. 372/45 |
| 2005/0199903 A1 | 9/2005 | Kyono et al. |
| 2006/0126688 A1* | 6/2006 | Kneissl .................. 372/43.01 |
| 2006/0243960 A1 | 11/2006 | Shimizu et al. |
| 2009/0047751 A1 | 2/2009 | Yoshimoto et al. |
| 2012/0108011 A1* | 5/2012 | Hata et al. .................. 438/113 |

FOREIGN PATENT DOCUMENTS

| | | |
|---|---|---|
| EP | 1-598-909 A2 | 11/2005 |
| JP | 09-309796 A | 12/1997 |

(Continued)

OTHER PUBLICATIONS

Cho H K et al: "Effect of growth interruptions on the light emission and indium clustering of InGaN/GaN multiple quantum wells," Applied Physics Letters, vol. 79, No. 16, Oct. 15, 2001, pp. 2594-2596.

*Primary Examiner* — Jessica Stultz
*Assistant Examiner* — Phillip Nguyen
(74) *Attorney, Agent, or Firm* — Venable LLP; Michael A. Sartori

(57) ABSTRACT

A method of making a nitride semiconductor laser comprises forming a first InGaN film for an active layer on a gallium nitride based semiconductor region, and the first InGaN film has a first thickness. In the formation of the first InGaN film, a first gallium raw material, a first indium raw material, and a first nitrogen raw material are supplied to a reactor to deposit a first InGaN for forming the first InGaN film at a first temperature, and the first InGaN has a thickness thinner than the first thickness. Next, the first InGaN is heat-treated at a second temperature lower than the first temperature in the reactor, while supplying a second indium raw material and a second nitrogen raw material to the reactor. Then, after the heat treatment, a second InGaN is deposited at least once to form the first InGaN film.

14 Claims, 11 Drawing Sheets

FOREIGN PATENT DOCUMENTS

| | | |
|---|---|---|
| JP | 10-199812 | 7/1998 |
| JP | 2000-49104 | 2/2000 |
| JP | 2000-082676 A | 3/2000 |
| JP | 2000-216101 | 8/2000 |
| JP | 2001-15808 A | 1/2001 |
| JP | 2001-102633 A | 4/2001 |
| JP | 2001-196632 A | 7/2001 |
| JP | 2001-326385 A | 11/2001 |
| JP | 2002-094113 A | 3/2002 |
| JP | 2002-344089 | 11/2002 |
| JP | 2003-68660 | 3/2003 |
| JP | 2003-304034 A | 10/2003 |
| JP | 2004-071885 A | 3/2004 |
| JP | 2004-165571 | 6/2004 |
| JP | 2004-297098 A | 10/2004 |
| JP | 2004-356522 A | 12/2004 |
| JP | 2007-043215 A | 2/2007 |
| JP | 2007-261936 A | 10/2007 |

* cited by examiner

METHOD OF MAKING NITRIDE SEMICONDUCTOR LASER, METHOD OF MAKING EPITAXIAL WAFER, AND NITRIDE SEMICONDUCTOR LASER

CROSS REFERENCE TO RELATED APPLICATIONS

This application is a Divisional of U.S. patent application Ser. No. 12/429,322 filed Apr. 24, 2009, which claims the benefit of Japan Patent Application No. 2008-115661, filed Apr. 25, 2008, both of which are incorporated herein by reference in their entirety.

BACKGROUND OF THE INVENTION

1. Field of the Invention

The present invention relates to a method of making a nitride semiconductor laser, a method of making an epitaxial wafer, and a nitride semiconductor laser.

2. Related Background Art

Patent document 1 (Japanese Patent Application No. 9-144291) discloses a method of forming a flat continuous GaN film. In the initial stage of deposition of the GaN film, the deposition for the GaN film is carried out under a film formation condition in the presence of a stoichiometrical excess amount of gallium (Ga). In the subsequent stage, the film is deposited under a film formation condition in the presence of a stoichiometrical excess amount of nitrogen (N). Over these stages, Ga and N are supplied onto a substrate in parallel.

Patent document 2 (Japanese Unexamined Patent Application Publication No. 2000-49104) discloses a method of forming a satisfactory monocrystalline GaAsN. In this deposition process of a GaAsN mixed crystal having a miscibility gap composition, the GaAsN mixed crystal is deposited by repeating the following: supply of Ga, nitriding, supply of Ga, and production of arsenide.

Patent document 3 (Japanese Unexamined Patent Application Publication No. 2000-216101) discloses a method of growing a GaInNAs compound semiconductor mixed crystal, which has an immiscible composition in a thermal equilibrium state. In the growth of GaInNAs compound semiconductor mixed crystal, the deposition of GaInNAs compound semiconductor mixed crystal is interrupted, and in the interrupt, a crystalline GaAs compound semiconductor thin film is deposited. GaAs compound semiconductor is composed of some of the constituent elements of the GaInNAs compound semiconductor mixed crystal, and has a miscible composition in a thermal equilibrium state.

Patent document 4 (Japanese Unexamined Patent Application Publication No. 2004-165571) discloses a method of forming a nitride thin film through deposition of a high-quality atomic layer within a short time. In this method, raw material containing an organometallic gas is blown onto a substrate under an ammonic atmosphere of $1 \times 10^{-3}$ to 1 Pa to form an elemental metal layer on the substrate. Subsequently, the blowing of raw material is interrupted to form a nitride thin film, that is, nitride of the elemental metal layer on the substrate.

Patent document 5 (Japanese Unexamined Patent Application Publication No. 2003-68660) discloses a method of making a nitride compound semiconductor layer through an organometallic vapor-phase epitaxy process. In this method, group III raw material, which contains a group III organo-metal material, is supplied intermittently onto a substrate while supplying nitrogen-containing gas onto the substrate.

SUMMARY OF THE INVENTION

An InGaN well layer having an indium-rich composition is used to achieve long-wavelength emission in a group III nitride semiconductor laser. The crystal quality of the InGaN well layer is lowered as the indium content is increased. This leads to increase of non-mission part in the InGaN well layer and thus low emission efficiency. Furthermore, such an increase in indium content facilitates a blue shift of the emission wavelength. In a group III nitride semiconductor laser with a large blue shift, the emission wavelength varies with an increase in current which is applied thereto in its LED mode, i.e., before its laser oscillation. Consequently, emission with a blue shift in the LED mode does not contribute to the stimulated emission for laser oscillation. In addition, the increase in indium content in an InGaN well layer broadens the full width at the half maximum of the photoluminescence spectrum. Such a broadened full width at the half maximum enlarges a wavelength band with an optical gain. The emission in the LED mode is generated in a wavelength region in which the emission does not contribute to the laser oscillation, which leads to a large amount of threshold current for laser oscillation.

According to the findings of the inventors, these phenomena relate to spatial fluctuation in the InGaN well layer.

It is an object of the present invention to provide a method of making a nitride semiconductor laser including an InGaN well layer having a highly homogeneous indium distribution. It is another object of the present invention to provide a method of making an epitaxial wafer for the nitride semiconductor laser. It is a further object of the present invention to provide a nitride semiconductor laser including an InGaN well layer having highly homogeneous indium distribution.

An aspect of the present invention provides a method of making a nitride semiconductor laser. This method includes the step of forming a first InGaN film for an active layer on a gallium nitride based semiconductor region. The first InGaN film has a first thickness. Forming a first InGaN film comprising the steps of (a) supplying a first gallium raw material, a first indium raw material, and a first nitrogen raw material to a reactor to deposit first InGaN for forming the InGaN film at a first temperature, the first InGaN having a thickness thinner than the first thickness; (b) heat-treating the InGaN at a second temperature higher than the first temperature in the reactor, while supplying a second indium raw material and a second nitrogen raw material to the reactor; and (c) after the heat treatment, depositing a second InGaN at least once to form the InGaN film.

According to the method, in order to form the first InGaN film, after depositing InGaN of a thickness smaller than the first thickness of the first InGaN film, the heat-treatment of the deposited InGaN at the second temperature higher than the growth temperature is carried out in an atmosphere containing an indium raw material and a nitrogen raw material. As a result, the homogeneity of composition of the deposited InGaN is improved. The method provides the formation of an InGaN film having a highly homogeneous composition. Supply of an indium raw material and a nitrogen raw material during the heat treatment can suppress the decomposition of InGaN and the desorption of InN.

In the method of the present invention, preferably the first indium raw material is an organic metal material. This method is suitable for deposition of nitride by organometallic vapor phase epitaxy method. In the method of the present invention, preferably the second indium raw material is an organic metal material. This method is suitable for deposition of nitride by organometallic vapor-phase epitaxy method.

In the method of the present invention, preferably the first nitrogen raw material includes at least one of ammonia and amines. This method is suitable for deposition of nitride by organometallic vapor-phase epitaxy. Furthermore, preferably the second nitrogen raw material includes at least one of ammonia and amines. This method is suitable for deposition of nitride by organometallic vapor-phase epitaxy.

In this method, examples of the amine nitrogen raw material encompass monomethylamine, dimethylamine, trimethylamine, monoethylamine, diethylamine, and triethylamine. According to this method, these amine nitrogen raw materials are suitable for deposition of InGaN at low temperature.

In the method of the present invention, the first InGaN film can be either the well layer or the barrier layer of the active layer. This method can provide an InGaN well layer and an InGaN barrier layer that have highly homogeneous compositions.

In the method of the invention, the first InGaN film includes a well layer of the active layer, and depositing a second InGaN includes repeating the deposition of the second InGaN and the heat-treating thereof alternately until the deposition of the first InGaN film is completed. In this method, the repetition of the deposition of InGaN and the subsequent heat treatment thereof improves homogeneity of the composition of the InGaN film. In addition, the well layer and the barrier layer can be made of InGaN. Alternatively, the well layer may be made of InGaN while a barrier layer may be made of GaN.

In the method of the present invention, preferably the first InGaN film includes the well layer of the active layer, and the molar ratio of indium of the first InGaN layer may range from 0.25 to 0.35. The method can form the InGaN well layer with high indium content. Consequently, the method can provide a long-wavelength emission device.

In the method of the present invention, the first InGaN film includes the barrier layer in the active layer, and the molar ratio of indium of the first InGaN layer may range from 0.02 to 0.08. According to the method, the resulting InGaN barrier layer is suitable for an InGaN well layer having high indium content. Consequently, the method can provide a long-wavelength emission device.

The method of the present invention may further comprises the steps of forming a second InGaN film for the active layer, second InGaN film having a second thickness. One of the first and second InGaN films is formed on another of the first and second InGaN films. Forming a second InGaN film comprises the steps of: (a) supplying a third gallium raw material, a third indium raw material, and a third nitrogen raw material to a reactor to deposit a third InGaN for forming the InGaN film at a third temperature, the third InGaN having a thickness thinner than the second thickness; (b) heat-treating the third InGaN at a fourth temperature higher than the third temperature after the deposition of the third InGaN, while supplying a fourth indium raw material and a fourth nitrogen raw material to the reactor; and (c) performing the deposition of a fourth InGaN and the heat treatment of the fourth InGaN at least once until the deposition of the second InGaN film is completed, to form the second InGaN film. One of the first and second InGaN films is formed for a well layer of the active layer, and the other of the first and second InGaN films is formed for a barrier layer of the active layer.

In this method, one of the first and second InGaN films is formed for the well layer of the active layer while the other is formed for the barrier layer. The well layer and barrier layer of the active layer therefore have a high homogeneity in indium compositions. It is preferred that the third nitrogen raw material include at least one of ammonia and amines. This method is suitable for deposition of nitride by use of organometallic vapor-phase epitaxy. Preferably the third indium raw material is an organic metal material. This method is suitable for deposition of nitride by use of organometallic vapor-phase epitaxy. It is preferred that the fourth nitrogen raw material include at least one of ammonia and amines. This method is suitable for deposition of nitride through organometallic vapor-phase epitaxy. Preferably the fourth indium raw material is an organic metal material. This method is suitable for deposition of nitride by use of organometallic vapor-phase epitaxy.

The method of the present invention may further comprises the step of preparing a wafer of a hexagonal crystalline material. An angle formed between the primary surface of the wafer and a c-plane of the hexagonal crystalline material ranges from 15 degrees to 30 degrees. This method can provide the fabrication method for a semiconductor laser on a semipolar hexagonal wafer.

In the method of the present invention, the first InGaN film may be formed for the well layer of the active layer at the first temperature ranging from 630° C. to 780° C. A semipolar InGaN layer having high indium content can be provided in the above temperature range.

The method of the present invention may further comprises preparing a wafer of a hexagonal crystalline material, and the primary surface of the wafer is a polar plane of the hexagonal crystalline material. This method can provide a fabrication method of a semiconductor laser on the polar hexagonal crystalline wafer.

In the method of the present invention, the first InGaN film may be formed for the well layer of the active layer at the first temperature ranging from 680° C. to 830° C. A polar InGaN layer having high indium content can be provided in this temperature range.

The method of the present invention may further comprises preparing a wafer of a hexagonal crystalline material, and the primary surface of the wafer is a nonpolar plane of the hexagonal crystalline material. This method can provide a fabrication method of a semiconductor laser on a non-semipolar hexagonal crystalline wafer.

In the method of the present invention, the first InGaN film may be formed for the well layer of the active layer at the first temperature ranging from 650° C. to 800° C. A nonpolar InGaN layer having high indium content can be provided in this temperature range.

In the method of the present invention, the active layer has a quantum well structure and provides a full width not exceeding 40 nm at the half maximum in a photoluminescence spectrum of the active layer. Since the method improves homogeneity of the composition of the InGaN film, the full width at half maximum in the photoluminescence spectrum can be reduced to be suitable for laser oscillation.

In the method of the present invention, the oscillation wavelength of the group III nitride semiconductor laser may be equal to or longer than 490 nm. The method provides a group III nitride semiconductor laser having a structure suitable for long-wavelength laser oscillation.

Another aspect of the invention provides a method of making an epitaxial wafer for a nitride semiconductor laser. The method comprises the steps of: (a) forming a first conductivity type gallium nitride based semiconductor region on a wafer; (b) after forming the first conductivity type gallium nitride based semiconductor region, forming an InGaN film for an active layer on the wafer, the InGaN film having a predetermined thickness; and (c) after forming the active layer, forming a second conductivity type gallium nitride based semiconductor region. Forming an InGaN film comprises the steps of: (b1) supplying a first gallium raw material, a first indium raw material and a first nitrogen raw material to a reactor to deposit a first InGaN for the first InGaN film at a first temperature, the InGaN having a thickness thinner than the first thickness; (b2) heat-treating the first InGaN at a second temperature higher than the first temperature, while supplying a second indium raw material and a second nitrogen raw material to the reactor; and (b3) after the heat treatment, depositing InGaN at least once to form the InGaN film.

According to the method, in order to form the first InGaN film, after depositing InGaN of a thickness smaller than the first thickness of the first InGaN film, the heat-treatment of the deposited InGaN at the second temperature higher than the growth temperature is carried out in an atmosphere containing an indium raw material and a nitrogen raw material. As a result, the homogeneity of composition of the deposited InGaN is improved. The method provides the formation of an InGaN film having a highly homogeneous composition. Supply of an indium raw material and a nitrogen raw material during the heat treatment after the deposition can suppress the decomposition of InGaN and the desorption of InN.

In the method of the invention, the InGaN film includes a well layer of the active layer, and depositing InGaN at least once comprises repeating the deposition of InGaN and the heat treatment alternately until the deposition of InGaN having the first thickness is completed. In this method, alternate arrangement of the plural depositions and the heat treatments can improve homogeneity of the composition of the InGaN film.

A further aspect of the invention provides a group III nitride semiconductor laser. The group III nitride semiconductor laser comprises: (a) a first conductivity type group III nitride semiconductor layer; (b) a second conductivity type of group III nitride semiconductor layer; and (c) an active layer having multiple $In_xGa_{1-x}N$ well layers and plural barrier layers, the active layer is provided between the first conductivity type of group III nitride semiconductor layer and the second conductivity type of group III nitride semiconductor layer, a molar ratio x of indium in the $In_xGa_{1-x}N$ well layer is equal to or more than 0.24. A distribution of a indium content in the $In_xGa_{1-x}N$ well layers has a maximum and a minimum, and the maximum and the minimum reside within a range from −15% to +15% of an average of the indium content in the well layers.

The group III nitride semiconductor laser exhibits high homogeneity of the composition in the $In_xGa_{1-x}N$ well layers, since the maximum and the minimum in the distribution of indium contents of the $In_xGa_{1-x}N$ well layers reside within the range from −15% to +15% of the average. The high homogeneous composition of the InGaN film leads to a reduction of the full width at half maximum to a range suitable for laser oscillation.

In the present invention, preferably each well layer comprises a plurality of $In_xGa_{1-x}N$ thin films, and the plurality of $In_xGa_{1-x}N$ thin films have a substantially same indium content as each other. The group III nitride semiconductor laser exhibits high homogeneity of the indium distribution of the individual $In_xGa_{1-x}N$ thin films because each of these $In_xGa_{1-x}N$ thin films has a small thickness. Consequently, the maximum and the minimum of the indium content distribution can be reduced to the range from −15% to +15% of the average.

BRIEF DESCRIPTION OF THE DRAWINGS

The above object and other objects, features and advantages of the present invention will become fully apparent through the preferred embodiments of the invention described in detail with reference to the attached drawings.

DESCRIPTION OF THE PREFERRED EMBODIMENTS

Figure 1:
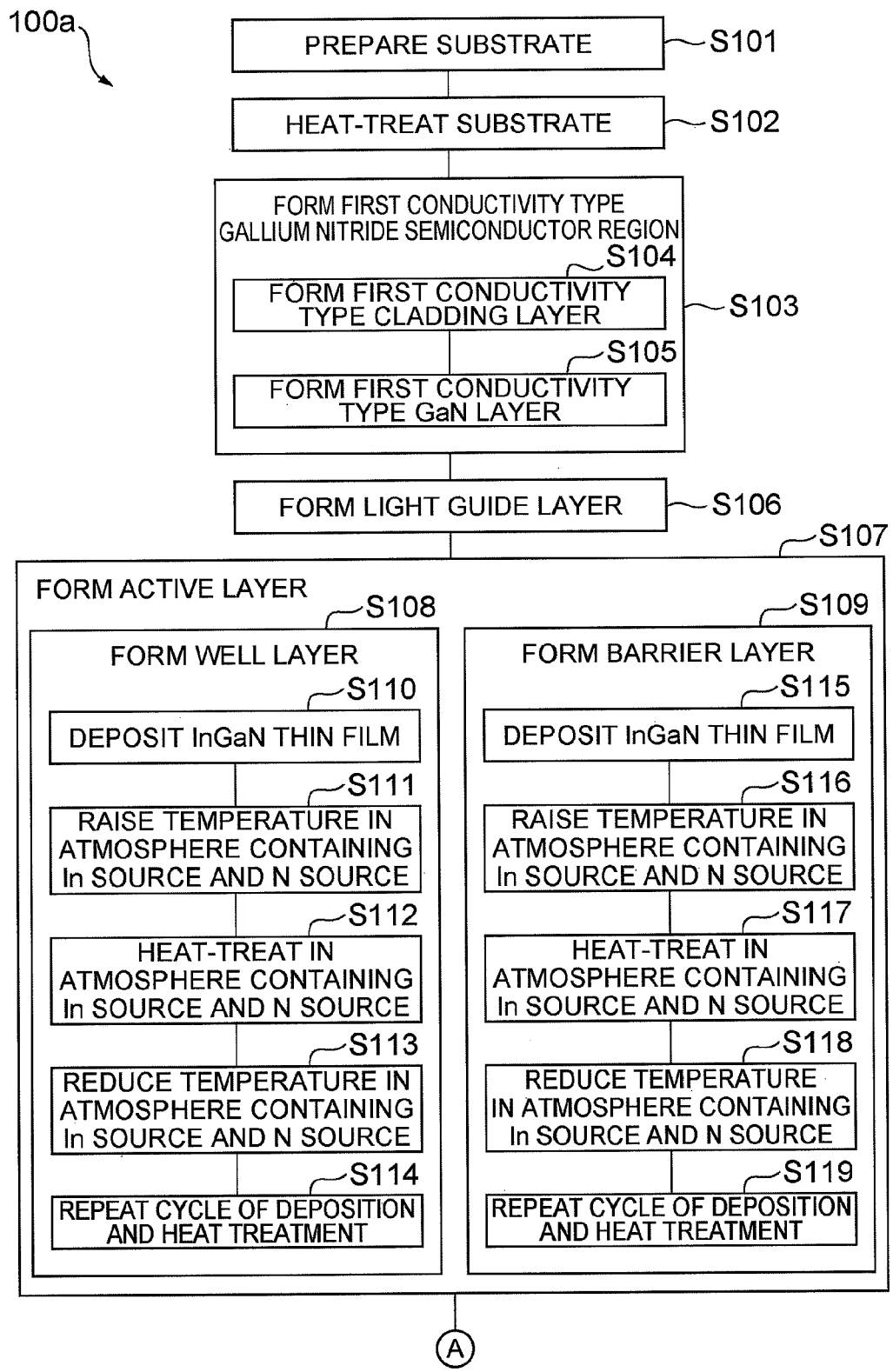
FIG. 1 is a diagram illustrating the primary steps in a method of making a group III nitride semiconductor laser and an epitaxial wafer according to the invention.

The invention will be easily understood taking into consideration of the following detailed description with reference to the attached drawings shown by way of examples. Embodiments of the invention of a method of making a nitride semiconductor laser, a method of making an epitaxial wafer, and a nitride semiconductor laser will be explained below in reference to the attached drawings. Identical reference numerals have been used, where possible, to designate identical elements that are common to the figures.

Figure 2:
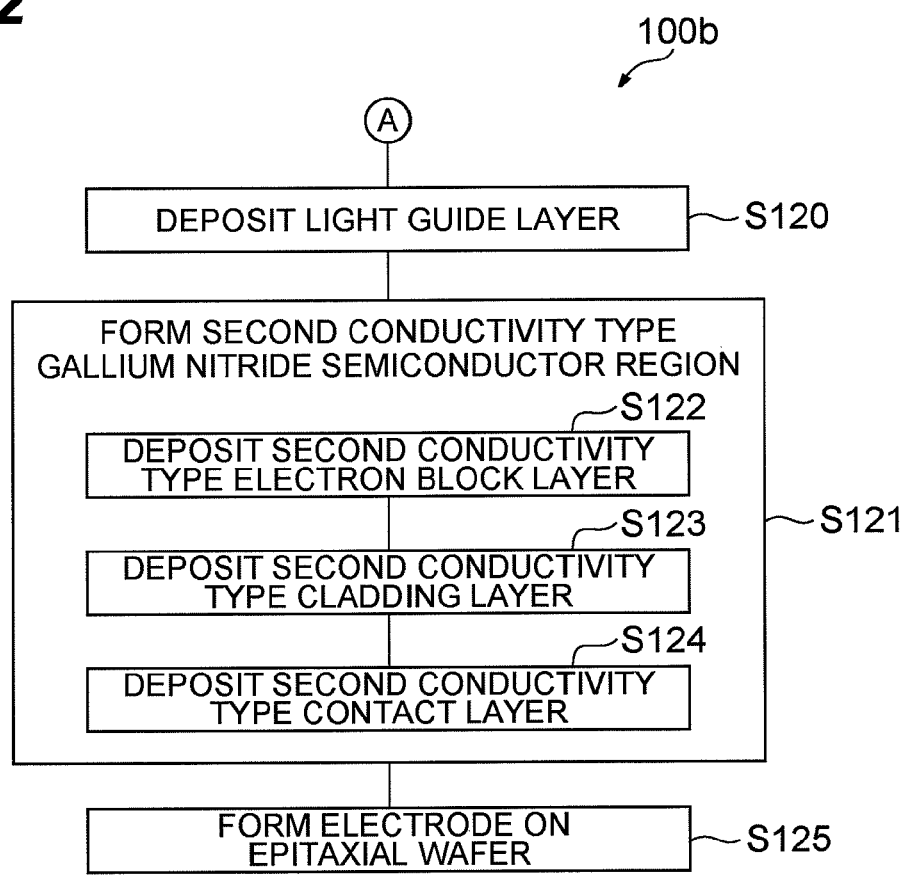
FIG. 2 is a diagram illustrating the primary steps in a method of making a group III nitride semiconductor laser and an epitaxial wafer according to the invention.

FIGS. 1 and 2 are diagrams illustrating the primary steps in a method of making a group III nitride semiconductor laser and an epitaxial wafer according to an embodiment of the invention. With reference to the step flow 100a, a wafer composed of a hexagonal crystalline material is prepared in Step 101. Available hexagonal crystalline material encompasses, for example, GaN, InGaN, AlGaN, AlN, SiC and sapphire. In the subsequent step, the epitaxial growth of a group III nitride semiconductor film is conducted on the primary surface of the wafer.

The primary surface of the wafer may be a semipolar plane, which forms a finite angle, i.e., tilt angle, with the c-plane of the hexagonal crystalline material. For example, an advantage in a tilt angle equal to or more than 15 degrees is that the inner electric field is weak. Another advantage in a tilt angle equal to or less than 30 degrees is that a wafer having a large diameter is available. The method enables the fabrication of a semiconductor laser on the semipolar hexagonal wafer, and the semiconductor laser has a small blue shift.

The primary surface of the wafer may be a polar plane of the hexagonal crystalline material. The polar plane of the hexagonal crystalline material may be the c-plane of GaN. The method enables the fabrication of a semiconductor laser on a polar hexagonal crystalline wafer.

Alternatively, the primary surface of the wafer may be a nonpolar plane of the hexagonal crystalline material. The nonpolar plane of the hexagonal crystalline material may be the a-plane or m-plane of GaN. The method enables the fabrication of a semiconductor laser on a wafer of nonpolar hexagonal crystalline material.

In the following typical explanation by way of examples, a semiconductor laser is prepared on a GaN wafer. In subsequent production steps, an epitaxial film is grown by organometallic vapor phase deposition, for example. The following raw materials can be used: trimethylgallium (TMG), trimethylaluminium (TMA), trimethylindium (TMIn), and ammonia ($NH_3$) are used, and as dopants, silane ($SiH_4$) and biscyclopentadienylmagnesium ($CP_2Mg$). After placing the GaN wafer in a reactor, the GaN wafer is subject to thermal cleaning in Step 102. For this thermal cleaning, hydrogen and ammonia are supplied to the reactor. The temperature of the heat-treatment is, for example, 1050° C.

In Step 103, an n-type gallium nitride based semiconductor region is grown on the primary surface of the wafer. In the growth of the n-type gallium nitride based semiconductor region, in Step 104, a cladding layer of an n-type gallium nitride based semiconductor is grown, for example. The cladding layer may be made of, for example, n-type $Al_{0.04}Ga_{0.96}N$, which can be grown at a growth temperature of 1050° C. The n-type AlGaN is doped with silicon. The thickness of the n-type AlGaN layer may be, for example, 2300 nm.

Subsequently, if necessary, an n-type gallium nitride based semiconductor layer may be grown on the cladding layer in Step 105. The band gap of the n-type gallium nitride based semiconductor layer is smaller than that of the cladding layer, but larger than that of an optical guide layer, which is grown in a later step. In addition, the refractive index of the n-type gallium nitride based semiconductor layer is larger than that of the cladding layer, but smaller than that of the optical guide layer. The n-type gallium nitride based semiconductor layer may be composed of, for example, n-type GaN. The growth temperature may be, for example, 1050° C. The thickness of the n-type GaN layer may be, for example, 50 nm. In this embodiment, the molar flow ratio [V]/[III] employed for the growth of AlGaN or GaN ranges from 900 to 6000. The pressure in the reactor for the growth of AlGaN is, for example, 40 kPa to 80 kPa, while the pressure for the growth of GaN or InGaN is, for example, 100 kPa.

In Step 106, an n-side optical guide layer is grown on the cladding layer. The optical guide layer may be composed of, for example, undoped $In_{0.06}Ga_{0.94}N$. The growth temperature of the InGaN may be, for example, 820° C. The thickness of the InGaN may be, for example, 65 nm. The growth temperature of the optical guide layer may range from 750° C. to 900° C.

In Step 107, an active layer is formed. In the method to prepare a group III nitride semiconductor laser, the active layer is formed so as to emit light of a lasing wavelength, for example, equal to or longer than 490 nm. In addition, the active layer is formed so as to emit light of a lasing wavelength, for example, equal to or shorter than 540 nm. The structure of the active layer suitable for long-wavelength laser is provided by the following growth process. In the formation of the active layer, a barrier layer is grown in Step 108, and a well layer is grown in Step 109. Preferably, indium raw materials include an organic metal, while nitrogen raw materials include at least one of ammonia and amines for the growth of the active layer, since these raw materials for the organometallic vapor phase epitaxy is suitable for the growth of nitrides. The amine nitrogen raw materials include at least one of monomethylamine, dimethylamine, trimethylamine, monoethylamine, diethylamine, and triethylamine. These amine nitrogen raw materials are suitable for low-temperature deposition of InGaN.

When the composition of a first barrier layer is the same as that of the optical guide layer, the barrier layer can be grown into a required thickness under the growth conditions for the optical guide layer to obtain both the optical guide layer and barrier layer. Then, on these layers, a well layer may be grown. Otherwise, an InGaN barrier layer is grown in Step 109, and a well layer may be grown on the barrier layer. The InGaN layer may have a composition of $In_{0.06}Ga_{0.94}N$, which may be undoped.

Figure 3:
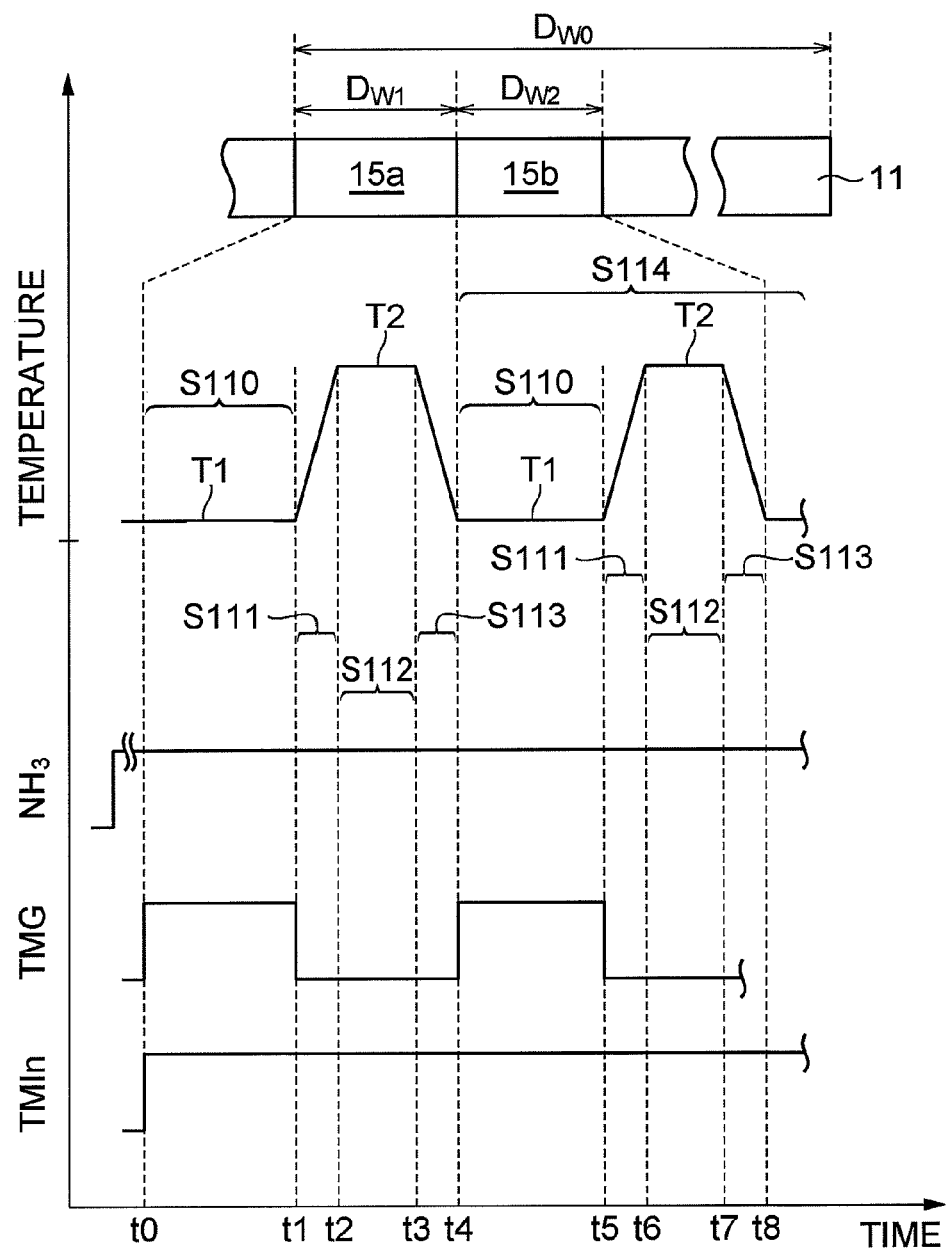
FIG. 3 is a timing diagram of gas supply and temperature change for making an active layer.

With reference to FIG. 3, in the growth of the well layer in Step 108, an InGaN film 11 for the active layer is formed on the gallium nitride based semiconductor region 13. The InGaN film having a thickness $D_{W0}$ is formed as follows. For example, in Step 110, an InGaN thin film is deposited during the time period from t0 to t1. In this step, a gallium raw material (e.g. TMG), an indium raw material (e.g. TMIn), and a nitrogen raw material (e.g. $NH_3$) are supplied to the reactor to deposit InGaN at a first temperature T1 such that the deposited InGaN has a thickness smaller than the thickness $D_{W0}$. The thickness $D_{W1}$ of the InGaN ($D_{W1}<D_{W0}$) is, for example, about 1 nm.

In Step 111, as illustrated in FIG. 3, the temperature in the reactor is changed from T1 to T2 (T1<T2) during the time period from t1 to t2. An indium raw material (e.g. TMIn) and a nitrogen raw material (e.g. $NH_3$) are supplied to the reactor during the change of the temperature. In the temperature-changing period, no film such as InN is formed. The supply of an indium raw material such as TMIn and a nitrogen raw material such as $NH_3$ prevents dissociation of InN from the surface of the InGaN thin film in the entire heat-treating period. InN will not be deposited at a temperature T1 of 600° C. or higher. The flow ratio [group V/group III] in the range from 100 to 100000 prevents InN from dissociating from the crystal. The heating time is, for example, two minutes. A flow ratio [group V/group III] of 10000 can be used, for example. Preferably, the difference between the growth temperature T1 and the heat-treatment temperature T2 is equal to or more than 50° C., and not higher than 250° C.

In Step 112, the temperature in the reactor is kept at T2 during the time period from t2 to t3. An indium raw material (e.g. TMIn) and a nitrogen raw material (e.g. $NH_3$) are supplied to the reactor while the temperature remains unchanged. No deposition such as InN occurs, as is the case with the above. The supply of the indium raw material TMIn and the nitrogen raw material $NH_3$ prevents dissociation of InN from the surface of the InGaN thin film. The heating time is, for example, one minute. The flow ratio [group V/group III] of 10000 can be used, for example.

In Step 113, the temperature of the reactor is changed from T2 to T1 (T1<T2) during the time period from t3 to t4. An indium raw material (e.g. TMIn) and a nitrogen raw material (e.g. $NH_3$) are supplied to the reactor during the change of the temperature. The temperature-changing time is, for example, two minutes. The flow ratio [group V/group III] of 10000 can be used, for example.

After the deposition in Step 110, the deposited InGaN thin film is reformed in Steps 111, 112 and 113. Consequently, the reformed InGaN thin film 15a has an improved homogeneity in its composition.

In Step 114, the deposition and heat-treatment of the thin film are repeated until the thickness of the deposited InGaN reaches a predetermined value. As illustrated in FIG. 3, Step 110 is conducted during the time period from t4 to t5, Step 111 is conducted during the time from t5 to t6, and Step 112 is conducted during the time from t6 to t7. In the deposition, another InGaN thin film having a thickness $D_{w2}$ is deposited on the InGaN thin film 15a. In the embodiment, the deposited InGaN film 11 has a total thickness of 3 nm through the repetition of these steps.

In this process, in order to form the InGaN film 11, after forming InGaN 15a into a thickness smaller than the thickness of the InGaN film 11 and then depositing InGaN 15b, these InGaNs are heat-treated at temperature T2 higher than growth temperature T1 in the atmosphere containing the indium raw material and the nitrogen raw material without supply of a gallium raw material. The relevant process improves the homogeneity of the composition of the deposited InGaN, and provides the deposited InGaN film 11 with high homogeneity in indium composition. The supply of the indium raw material and the nitrogen raw material during the heat-treatment following the deposition step suppresses the decomposition of InGaN and the desorption of InN.

Figure 4:
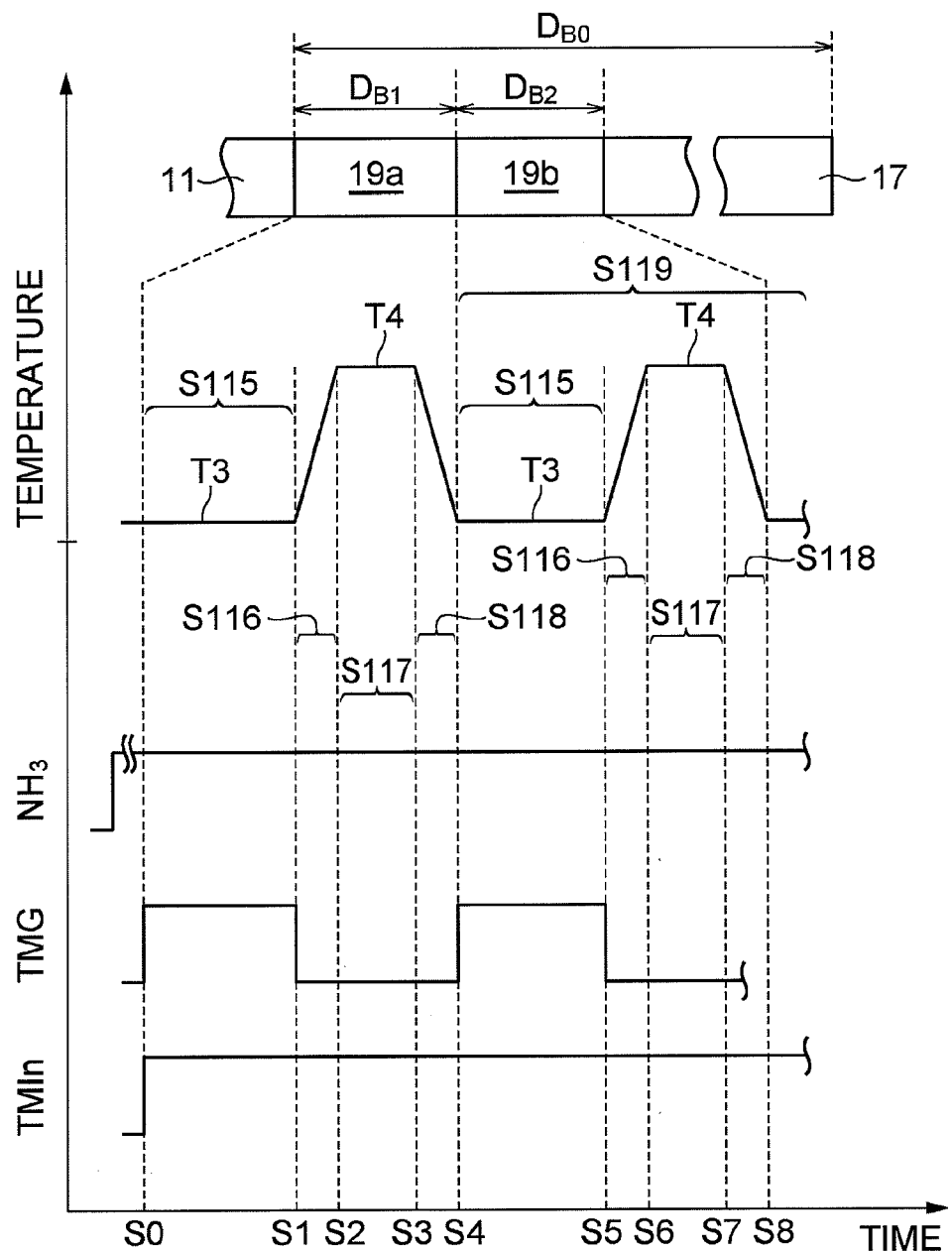
FIG. 4 is another timing diagram of gas supply and temperature change for making an active layer.
Figure 5:
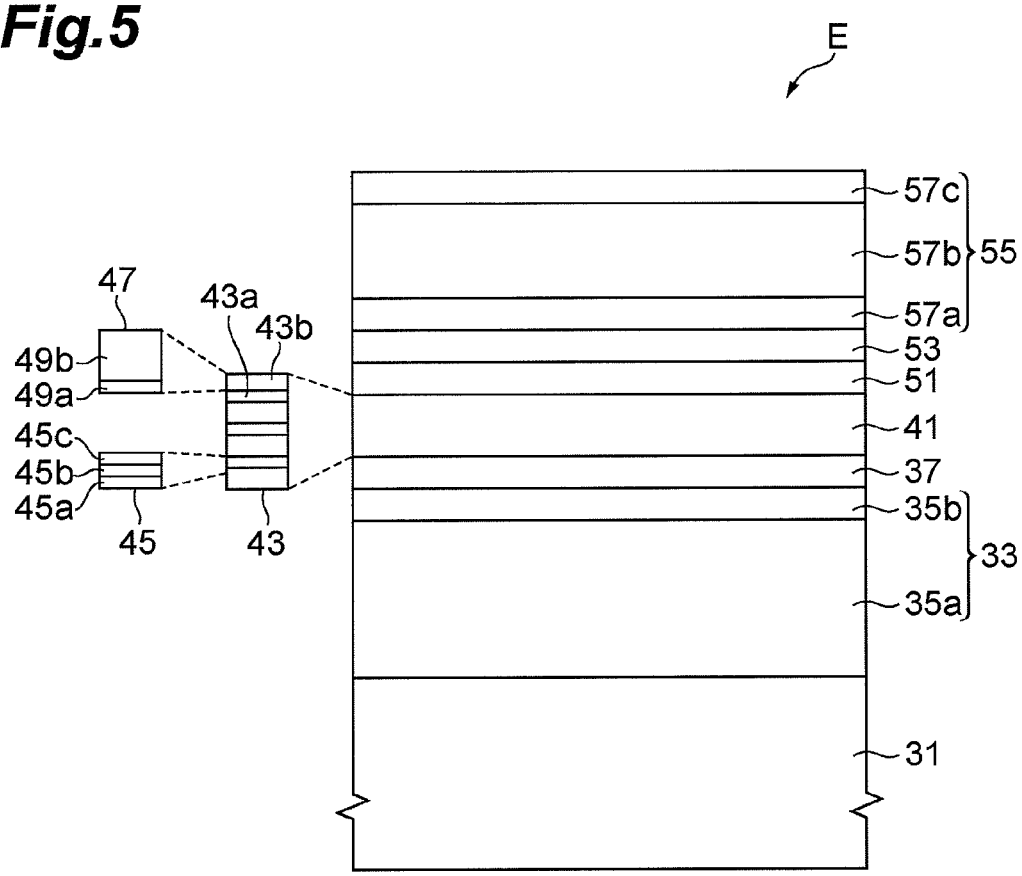
FIG. 5 is a view illustrating the layer structure of an epitaxial wafer.

In the growth of a barrier layer in Step 109, as illustrated in FIG. 4, an InGaN film 17 for an active layer is formed on the well layer. The InGaN film 17 for the barrier layer has a film thickness $D_{B1}$. The InGaN film 17 is grown, for example, as follows: In Step 115, an InGaN thin film is deposited during the time period from s0 to s1. For the deposition, a gallium raw material (e.g. TMG), an indium raw material (e.g. TMIn), and a nitrogen raw material (e.g. NH$_3$) are supplied to the reactor, and InGaN is deposited at a first temperature T3 to form a film of thickness $D_{B1}$ thinner than $D_{B0}$ ($D_{B1}$<$D_{B0}$). The film thickness $D_{B1}$ of InGaN is, for example, about 1 nm. The supply of the gallium raw material is stopped to complete the deposition.

In Step 116, as illustrated in FIG. 4, the growth temperature is changed from T3 to T4 (T3<T4) during the time period from s1 to s2. An indium raw material (e.g. TMIn) and a nitrogen raw material (e.g. NH$_3$) are supplied to the reactor during the temperature change. No film such as InN is formed during the temperature change. The supply of the indium raw material TMIn and the nitrogen raw material such as NH$_3$ prevents dissociation of InN from the surface of InGaN thin film. The conditions required may be, for example, identical to those for the well layer. The time for heating is, for example, one minute. The flow ratio [group V/group III] of 10000 can be used, for example.

In Step 117, the growth temperature is kept at T4 during the time period from s2 to s3. An indium raw material (e.g. TMIn) and a nitrogen raw material (e.g. NH$_3$) are supplied to the reactor while keeping the temperature. No film such as InN is formed, as is the case with the above. The supply of the indium raw material, such as TMIn, and the nitrogen raw material, such as NH$_3$, prevents dissociation of InN from the surface of InGaN thin film. The heating time is, for example, one minute. The flow ratio [group V/group III] of 10000 can be used, for example.

In Step 118, the temperature of the reactor is changed from T4 to T3 (T3<T4) during the time period from s3 to s4. An indium raw material (e.g. TMIn) and a nitrogen raw material (e.g. NH$_3$) are supplied to the reactor during the temperature-changing period. The temperature-changing time is, for example, two minutes. The flow ratio [group V/group III] of 10000 can be used, for example. Preferably the difference between growth temperature T3 and heat treatment temperature T4 is, for example, not less than 50° C. and not higher than 150° C.

After the deposition in Steps 115, the deposited InGaN thin film is reformed in Steps 116, 117 and 118. Consequently, the reformed InGaN thin film 19a has a composition distribution of improved homogeneity.

In Step 119, the deposition and the heat treatment of the thin film are repeated until the thickness of the deposited InGaN reaches a predetermined thickness. As illustrated in FIG. 4, Step 115 is conducted during the time period from s4 to s5, Step 116 is conducted during the time from s5 to s6, and Step 117 is conducted during the time from s6 to s7. Although an InGaN thin film 19b is grown on the InGaN thin film 19a in a single deposition step, the deposited InGaN film 17 having a total thickness of 15 nm can be grown through the repetition of these steps in the embodiment. For example, an InGaN thin film having a thickness $D_{B2}$ is deposited in a single deposition cycle. Alternatively, since the indium content of the barrier layer is less than that of the well layer, the remaining InGaN film may be grown into a predetermined thickness, instead of 14 repetition cycles. In the embodiment, one additional deposition step completes the formation of the InGaN barrier layer having a total thickness of 15 nm. The barrier layer may be composed of GaN instead of InGaN. In the formation of the barrier layer of GaN, a single deposition step can be used to form a GaN film of a predetermined thickness.

In the process, in order to form an InGaN film 17, after every deposition of InGaN 19a and 19b each having a thickness smaller than the thickness of the InGaN film 17, heat-treatment of the InGaN 19a and 19b are conducted at a temperature T4 higher than the growth temperature T3 in the atmosphere including the indium raw material and the nitrogen raw material. This process improves the homogeneity of the composition of the deposited InGaN. The thus deposited InGaN film 17 has a composition of high homogeneity. Although the InGaN is subject to atmosphere of a temperature higher than the growth temperature, the supply of the indium raw material and the nitrogen raw material during the heat treatment which follows the deposition suppresses the decomposition of InGaN and the desorption of InN.

In the subsequent step, in order to form an active layer, Steps 108 and 109 are repeated until a predetermined quantum well structure is formed. The active layer having the thus formed quantum well structure exhibits photoluminescence spectrum with a full width at half maximum not exceeding 40 nm. Due to improvement of homogeneity in the composition of the InGaN film, the full width at half maximum is reduced to a value that enables the laser oscillation. The small full width at half maximum in the photoluminescence spectrum results in a narrow width of an optical spectrum that is emitted in an LED mode prior to emission of a laser beam from the semiconductor laser. The applied current can thus be consumed effectively to cause laser oscillation.

Preferably, the molar ratio of indium in the InGaN films 11, 15a and 15b is equal to or more than 0.25 and equal to or less than 0.35. The InGaN well layer of a high indium content can provide a long-wavelength light-emitting device. The molar ratio of indium in the InGaN films 17, 19a and 19b may be equal to or more than 0.02 and equal to or less than 0.08. It is preferable to form an InGaN barrier layer suitable for the InGaN well layer having a high indium content that provides a long-wavelength light-emitting device.

Preferably, the growth temperatures of InGaN for an active layer are, for example, in the following ranges.

It is preferable that an active layer be deposited on a semi-polar surface of the gallium nitride based semiconductor under the following conditions. The growth temperature T1 of the InGaN film 11 for the well layer may be equal to or more than 630° C. to ensure favorable emission properties. The growth temperature T1 may be equal to or less than 780° C. to ensure a required indium content. This temperature range enables the production of a semipolar InGaN layer having a high indium content. Also, the growth temperature T3 of the InGaN film 11 for the barrier layer may be equal to or more than 750° C. to yield a high-quality crystal. The growth temperature T3 may be equal to or less than 900° C. to maintain high crystal quality of the well layer by avoiding deterioration by heat. These temperature ranges enable the production of a semipolar InGaN layer having a high indium content.

In is preferable that an active layer be deposited on a polar surface of a gallium nitride based semiconductor under the following conditions. The growth temperature T1 of the InGaN film 11 for the well layer may be equal to or more than 680° C. to ensure favorable emission properties. The growth temperature T1 may be equal to or less than 830° C. to ensure a required indium content. This temperature range enables the production of a polar InGaN layer with a high indium content. Also, the growth temperature T3 of the InGaN film 11 for the barrier layer may be equal to or more than 800° C. to obtain a high-quality crystal. The growth temperature T3 may be equal to or less than 900° C. to maintain the quality of the well layer at high level by avoiding deterioration by the heat. These temperature ranges enable the production of a polar InGaN layer with a high indium content.

Preferably, an active layer is deposited on a nonpolar surface of gallium nitride based semiconductor under the following condition. The growth temperature T1 of the InGaN film 11 for the well layer may be equal to or more than 650° C. to ensure favorable emission properties. The growth temperature T1 may be equal to or less than 800° C. to ensure a required indium content. Also, the growth temperature T3 of the InGaN film 11 for the barrier layer may be be equal to or more than 780° C. to yield a high-quality crystal. The growth temperature T3 may be equal to or less than 900° C. to maintain high crystal quality of the well layer by avoiding deterioration by heat. These temperature ranges enable the production of a nonpolar InGaN layer with a high indium content.

With reference to the flow chart shown in FIG. 2, in Step 120, a p-side optical guide layer is grown on the active layer. The optical guide layer may be composed of, for example, undoped $In_{0.06}Ga_{0.94}N$. The growth temperature may be, for example, 820° C. The film thickness of the p-type InGaN may be, for example, 50 nm. The growth temperature of the optical guide layer may range, for example, from 750° C. to 900° C. If necessary, in Step 120, an undoped GaN layer may be deposited on an InGaN layer. The growth temperature may be, for example, 820° C.

In Step 121, a p-type gallium nitride based semiconductor region is formed on the p-side optical guide layer. In the growth of the p-type gallium nitride based semiconductor region in Step 122, for example, an electron block layer of p-type gallium nitride based semiconductor is grown on the p-side optical guide layer. The electron block layer may be composed of, for example, p-type $Al_{0.18}Ga_{0.82}N$, and its growth temperature may be, for example, 1050° C. This p-type AlGaN is doped with magnesium. The film thickness of the p-type AlGaN may be, for example, 20 nm.

In Step 123, a cladding layer of p-type gallium nitride based semiconductor is grown, for example, on the electron block layer. The cladding layer may be composed of, for example, p-type $Al_{0.06}Ga_{0.94}N$, and its growth temperature may be, for example, 1050° C. This p-type AlGaN is doped with magnesium. The thickness of the p-type AlGaN may be, for example, 400 nm.

In Step 124, a contact layer of p-type gallium nitride based semiconductor is grown, for example, on the cladding layer. The contact layer may be composed of p-type GaN, and its growth temperature may be, for example, 1050° C. This p-type GaN is doped with magnesium. The thickness of the p-type GaN may be, for example, 50 nm.

Through these steps, an epitaxial wafer E including the multiple gallium nitride based semiconductor epitaxial films grown on a wafer are formed. The epitaxial wafer E includes a first conductivity type gallium nitride based semiconductor wafer 31, a first conductivity type gallium nitride based semiconductor region 33, an optical guide layer 37, an active layer 41 including one ore more well layers each having a high homogeneity of indium content, optical guide layers 51 and 53, and a second conductivity type gallium nitride based semiconductor region 55. The first conductivity type gallium nitride based semiconductor region 33 includes, for example, an n-type cladding layer 35a and an n-type GaN layer 35b. The second conductivity type gallium nitride based semiconductor region 55 includes, for example, a p-type electron block layer 57a, a p-type cladding layer 57b and a p-type contact layer 57c.

The active layer 41 may have multiple quantum well structures including well layers 43a and barrier layers 43b alternately arranged. The well layer 43a is composed of an InGaN stack 45 that is made of multiple InGaN thin films 45a, 45b and 45c, having a substantially identical indium content. Preferably, each thickness of the InGaN thin films 45a, 45b and 45c ranges, for example, from 0.3 nm to 3.0 nm. In this range, the individual InGaN thin films 45a, 45b and 45c are deposited so as to improve the homogeneity of the indium content. The maximum and the minimum of the indium content distribution in the InGaN well layers reside within the range from −15% to +15% of the average. Also, the barrier layer 43b is composed of an InGaN stack 47 that is made of multiple InGaN thin films 49a and 49b, having a substantially identical indium content. The active layer of the quantum well structure exhibits a photoluminescence spectrum with a full width at half maximum not exceeding 40 nm. Improved homogeneity of the composition of the InGaN film reduces the full width at half maximum of the PL spectrum to cause lasing. The epitaxial wafer E can be used for the group III nitride semiconductor laser including an active layer to provide lasing at a long wavelength, for example, equal to or more than 490 nm.

In reference to FIG. 2 again, a method of making a group III nitride semiconductor laser using epitaxial wafer E is explained below. In Step 125, an electrode is formed. Prior to the formation of an electrode, a ridge structure for a laser stripe may be formed on the epitaxial wafer E. The ridge width is, for example, 1.5 μm, and the ridge depth is, for example, 500 nm. Subsequently, an insulating film having a contact window on the ridge structure is formed. The insulating film may be composed of, for example, silicon oxide (e.g. $SiO_2$). A first electrode (e.g. anode) is formed on the contact layer and the insulating layer. The back surface of the epitaxial wafer E may be ground to form a substrate product. After grinding the back surface, a second electrode (e.g. cathode) is formed on the back side. Subsequently it is annealed for alloying. A laser bar is formed by cleaving the substrate product. The cavity length is, for example, 600 μm. Subsequently, a reflecting film is formed on the cleaved facets. After forming semiconductor laser dies by separation, each laser die is assembled to form an assembled laser for evaluating its electric properties.

Figure 6:
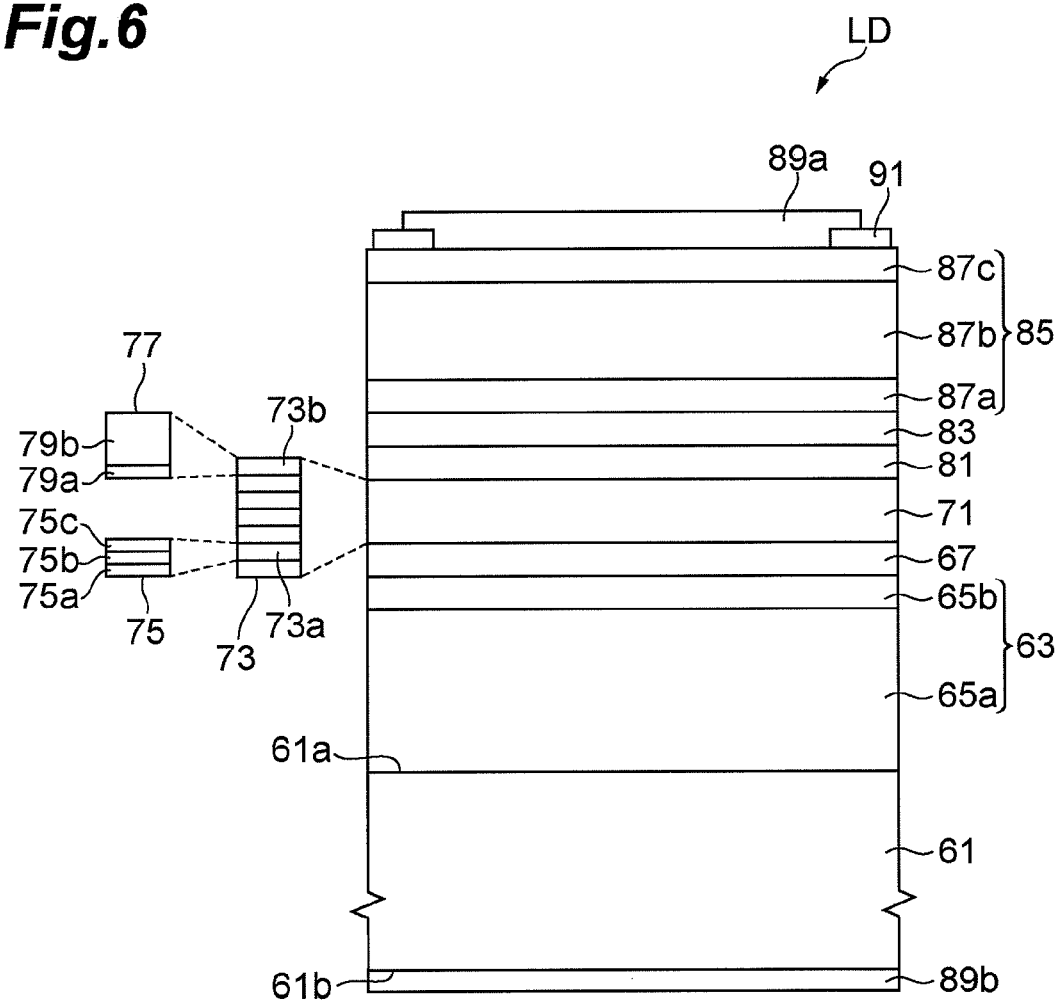
FIG. 6 is a view illustrating the layer structure of a semiconductor laser.

FIG. 6 illustrates an exemplary structure of the completed group III nitride semiconductor laser. The group III nitride semiconductor LD includes a first conductivity type gallium nitride based semiconductor substrate 61, a first conductivity type gallium nitride based semiconductor region 63, an optical guide layer 67, an active layer 71 including a well layer having a high homogeneity of indium content, optical guide layers 81 and 83, and a second conductivity type gallium nitride based semiconductor region 85. The first conductivity type gallium nitride based semiconductor region 63, the optical guide layer 67, the active layer 71 including a well layer having a high homogeneity of indium content, the optical guide layers 81 and 83, and the second conductivity type gallium nitride based semiconductor region 85 are grown on a primary surface 61a of the support substrate 61. The first conductivity type gallium nitride based semiconductor region 63 includes, for example, an n-type cladding layer 65a and an n-type GaN layer 65b. The second conductivity type gallium nitride based semiconductor region 85 includes, for example, a p-type electron block layer 87a, a p-type cladding layer 87b, and a p-type contact layer 87c. The first electrode 89a is in contact with the contact layer 87c through a contact window of the insulating film 91. The second electrode 89b is in contact with the back side 61b of the support substrate 61.

A well layer 73a in the active layer 71 is composed of multiple InGaN thin films 75a, 75b and 75c having a substantially identical indium content, thereby improving the homogeneity of indium content in the individual InGaN thin films 75a, 75b and 75c. The molar ratio of indium in an InGaN well layer is, for example, not less than 0.24. The maximum and the minimum of the indium content distribution in the InGaN well layers reside within the range from −15% to +15% of the average. An InGaN stack 77 of the barrier layers 73b is composed of multiple InGaN thin films 79a and 79b having a substantially identical indium content. The active layer of the quantum well structure exhibits a photoluminescence spectrum with a full width at half maximum not exceeding 40 nm. Since the homogeneity of the composition of the InGaN film is improved, the full width at half maximum becomes reduced to be suitable for laser oscillation. The reduced full width at half maximum results in a narrow spectrum width emitted in an LED mode of the semiconductor laser prior to its laser oscillation with a longer wavelength of 490 nm or more. The applied current can thus be consumed effectively for lasing.

EXAMPLE 1

Figure 7:
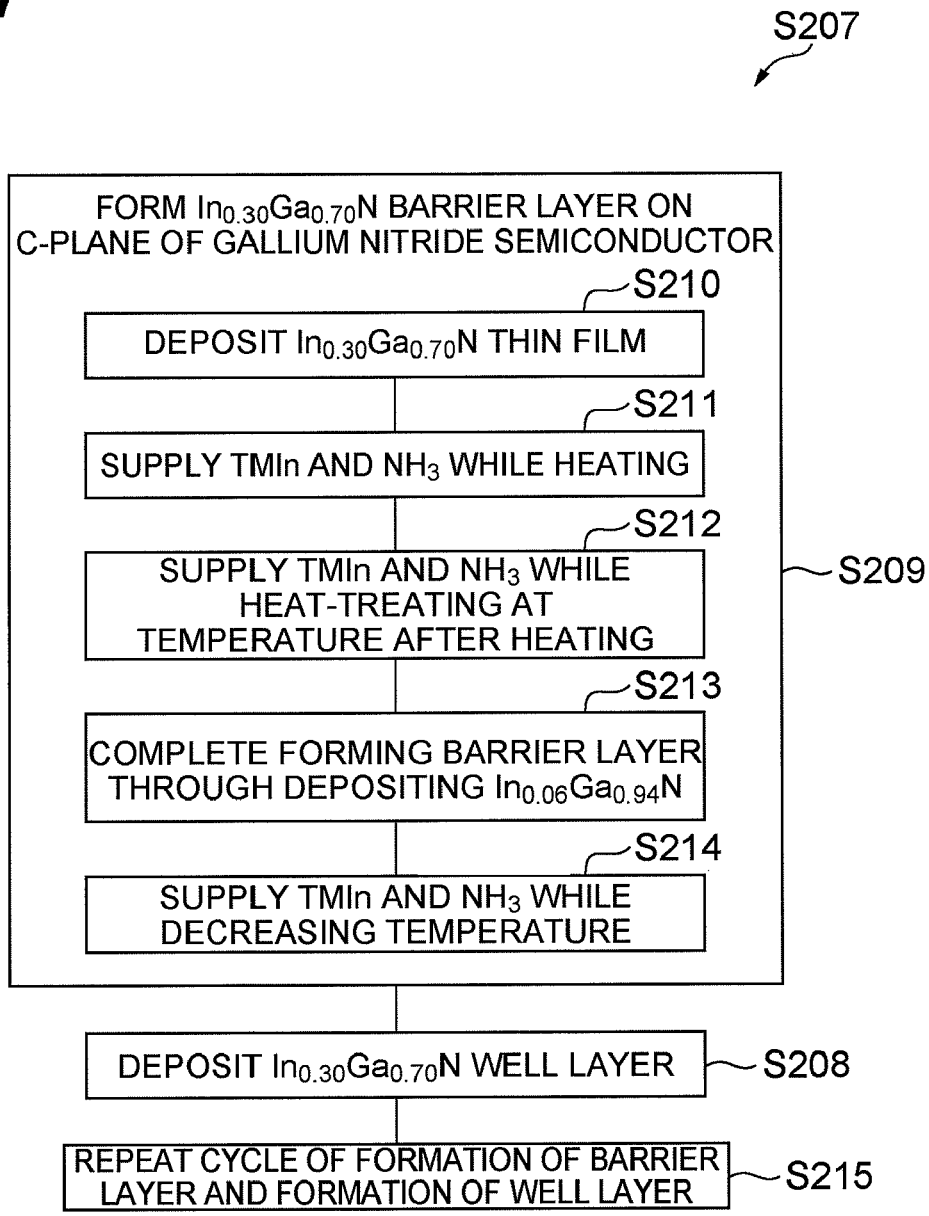
FIG. 7 is a flow chart illustrating the primary steps of making an active layer in Example 1.

A group III nitride semiconductor laser was fabricated on the c-plane of a GaN wafer as described in the embodiments above, with the exception of the formation of an active layer. The growth temperature was changed using a resistive heater of a susceptor. FIG. 7 illustrates the primary steps of forming the active layer for the group III nitride semiconductor laser in Example 1. In Step 207, the active layer was formed by the method illustrated in FIG. 7 through organometallic vapor phase epitaxy. After an $In_{0.30}Ga_{0.70}N$ well layer having a thickness of 3 nm was grown at 700° C., in Step 209, an $In_{0.06}Ga_{0.94}N$ barrier layer was grown. First, in Step 210, the $In_{0.06}Ga_{0.94}N$ thin film having a thickness of 1 nm was deposited at 700° C. After the deposition of the thin film, in Step 211, the growth temperature was changed to 850° C. in two minutes, while TMIn and $NH_3$ were supplied to the reactor. In Step 212, the growth temperature remains unchanged at 850° C. for one minute. After keeping the temperature, in Step 213, TMG, TMIn and $NH_3$ were supplied to the reactor to grow a $In_{0.06}Ga_{0.94}N$ thin film having a thickness of 14 nm at 850° C. Consequently, the $In_{0.06}Ga_{0.94}N$ barrier layer having a thickness of 15 nm was deposited. Through Steps 211 to 213, the ratio $[NH_3]/[TMIn]$ was used at 10000. After the deposition of the $In_{0.06}Ga_{0.94}N$ barrier layer, in Step 214, $NH_3$ was supplied to the reactor, while the growth temperature was changed to 700° C. over two minutes. In Step 208, an $In_{0.30}Ga_{0.70}N$ well layer having a thickness of 3 nm was grown at 700° C. In Step 215, these steps were repeated to form three well layers and four barrier layers alternately stacked.

A photoluminescence (PL) spectrum of the epitaxial wafer was measured using excitation laser beam having a wavelength of 405 nm. The peak wavelength of the PL was 570 nm with a full width at half maximum of 38 nm. A semiconductor laser of a ridge structure was fabricated as described in the embodiments above. The threshold current density $I_{th}$ of the semiconductor laser was 18 kA/cm². The peak wavelength of the semiconductor laser was 510 nm. In this energization, the period was five microseconds and the duty ratio was 0.05%.

EXAMPLE 2

Figure 8:
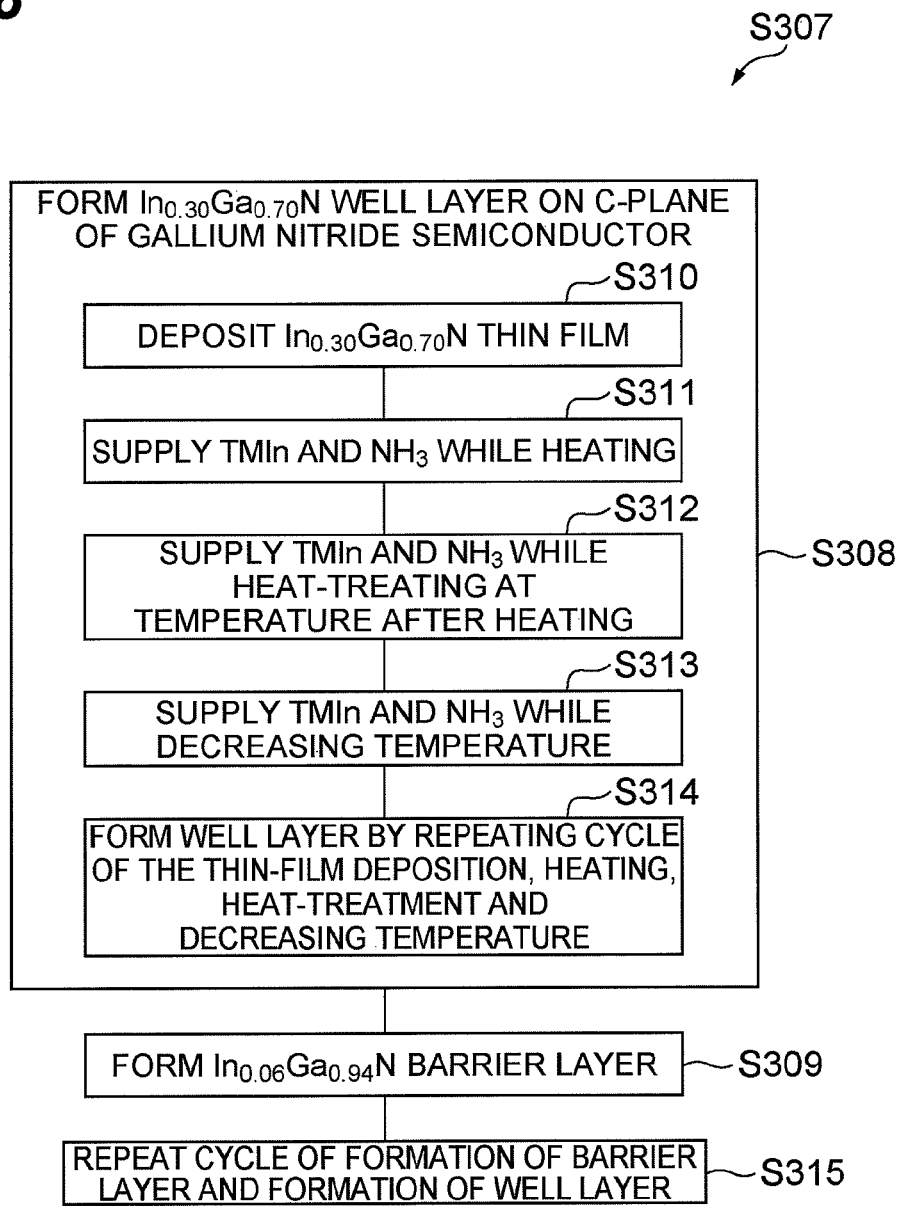
FIG. 8 is a flow chart illustrating the primary steps of making an active layer in Example 2.

A group III nitride semiconductor laser was fabricated on the c-plane of a GaN wafer as described in the embodiments above, with the exception of the formation of an active layer. The growth temperature was changed using an infrared lamp heater of a susceptor. The infrared lamp required only 10 to 30 seconds for temperature rise from 700° C. to 850° C. and temperature fall, whereas a resistive heater required about three to five minutes therefor. FIG. 8 illustrates the primary steps of forming the active layer of the group III nitride semiconductor laser in Example 2. In Step 308, the active layer was formed. First, in Step 310, an $In_{0.30}Ga_{0.70}N$ thin film having a thickness of 1 nm was deposited at 700° C. After the deposition of the thin film, in Step 311, the growth temperature was changed to 850° C. in about ten seconds, while TMIn and $NH_3$ were supplied to the reactor. In Step 312, the growth temperature was kept at 850° C. for about ten seconds. Then, in Step 313, the growth temperature was changed to 700° C. in about 15 seconds, while TMIn and $NH_3$ were supplied to the reactor. Through Step 311 to 313, the ratio $[NH_3]/[TMIn]=10000$ was kept. In Step 314, two $In_{0.30}Ga_{0.70}N$ thin layers were deposited by performing two cycles of the thin-film deposition, temperature rise, heat treatment and temperature fall. Each of the $In_{0.30}Ga_{0.70}N$ thin films has a thickness of 1 nm. Consequently, the deposited $In_{0.30}Ga_{0.70}N$ well layer had a thickness of 3 nm. In Step 309, TWIG, TMIn and $NH_3$ were supplied to the reactor, while an $In_{0.06}Ga_{0.94}N$ barrier layer was deposited at 850° C. In Step 315, these steps were repeated to form three well layers and four barrier layers alternately arranged.

A PL spectrum of the epitaxial wafer was measured using excitation laser beam of a wavelength of 405 nm. The peak wavelength of the PL spectrum was 570 nm with a full width at half maximum of 35 nm. A semiconductor laser of a ridge structure was prepared as described in the embodiments above. The threshold current density $I_{th}$ of the semiconductor laser was 15 kA/cm². The peak wavelength of the semiconductor laser was 510 nm.

EXAMPLE 3

Figure 9:
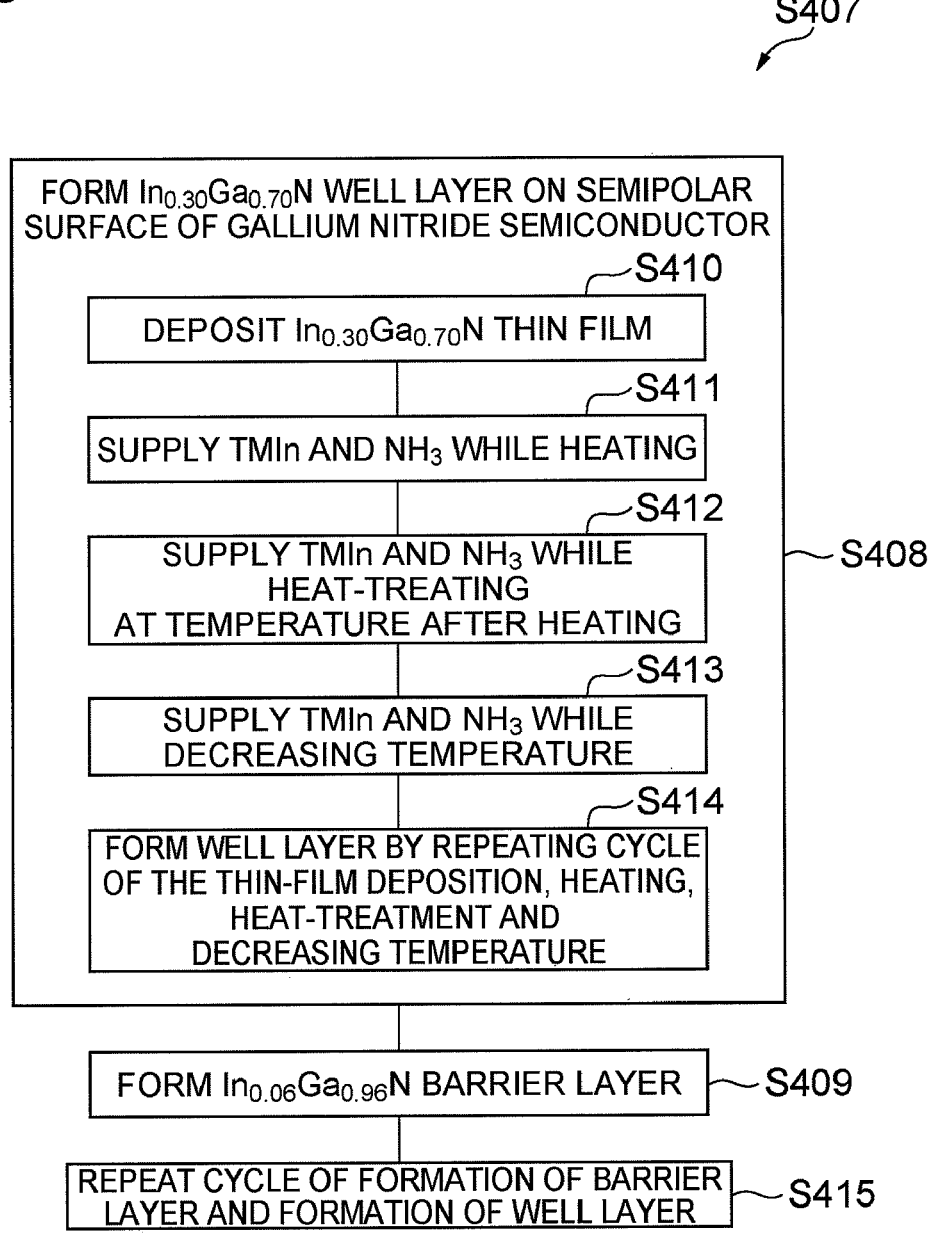
FIG. 9 is a flow chart illustrating the primary steps of making an active layer in Example 3.

A group III nitride semiconductor laser was fabricated on a semipolar surface of a GaN wafer in the manner as described in the embodiments above, with the exception of the formation of an active layer, and the semipolar surface is tilted with reference to the c-plane by 21 degrees toward the direction of the a-axis. The growth temperature was changed using an infrared lamp heater of a susceptor. FIG. 9 illustrates the primary steps of forming the active layer of the group III nitride semiconductor laser in Example 3. In Step 407, an active layer was formed. First, in Step 410, an $In_{0.30}Ga_{0.70}N$ thin film having a thickness of 1 nm was deposited at 670° C. After the deposition of the thin film, in Step 411, TMIn and $NH_3$ were supplied to the reactor, while the growth temperature was changed to 850° C. in about ten seconds. In Step 412, the growth temperature was kept at 850° C. for about ten seconds. After keeping the temperature, in Step 413, the growth temperature was changed to 670° C. in about 15 seconds, while TMIn and $NH_3$ were supplied to the reactor. Through Steps 411 to 413, the ratio $[NH_3]/[TMIn]$ was maintained at 10000. In Step 414, two $In_{0.30}Ga_{0.70}N$ thin layers were deposited by performing two cycles of thin-film deposition, temperature rise, heat-treatment and temperature fall. Each of the $In_{0.30}Ga_{0.70}N$ thin films has a thickness of 1 nm. Consequently, the deposited $In_{0.30}Ga_{0.70}N$ well layer had a thickness of 3 nm. In Step 409, an $In_{0.06}Ga_{0.94}N$ barrier layer was grown at 820° C., while TMG, TMIn and $NH_3$ were supplied to the reactor. In Step 415, these steps were repeated to form three well layers and four barrier layers alternately arranged.

A PL spectrum of the epitaxial wafer was measured using excitation laser beam of a wavelength of 405 nm. The peak wavelength of the PL spectrum was 570 nm with a full width at half maximum of 35 nm. By m-plane cleavage, a semiconductor laser of a ridge structure was fabricated as described in the embodiments above. The threshold current density $I_{th}$ of the semiconductor laser was 15 kA/cm². The peak wavelength of the semiconductor laser was 510 nm.

EXAMPLE 4

Figure 10:
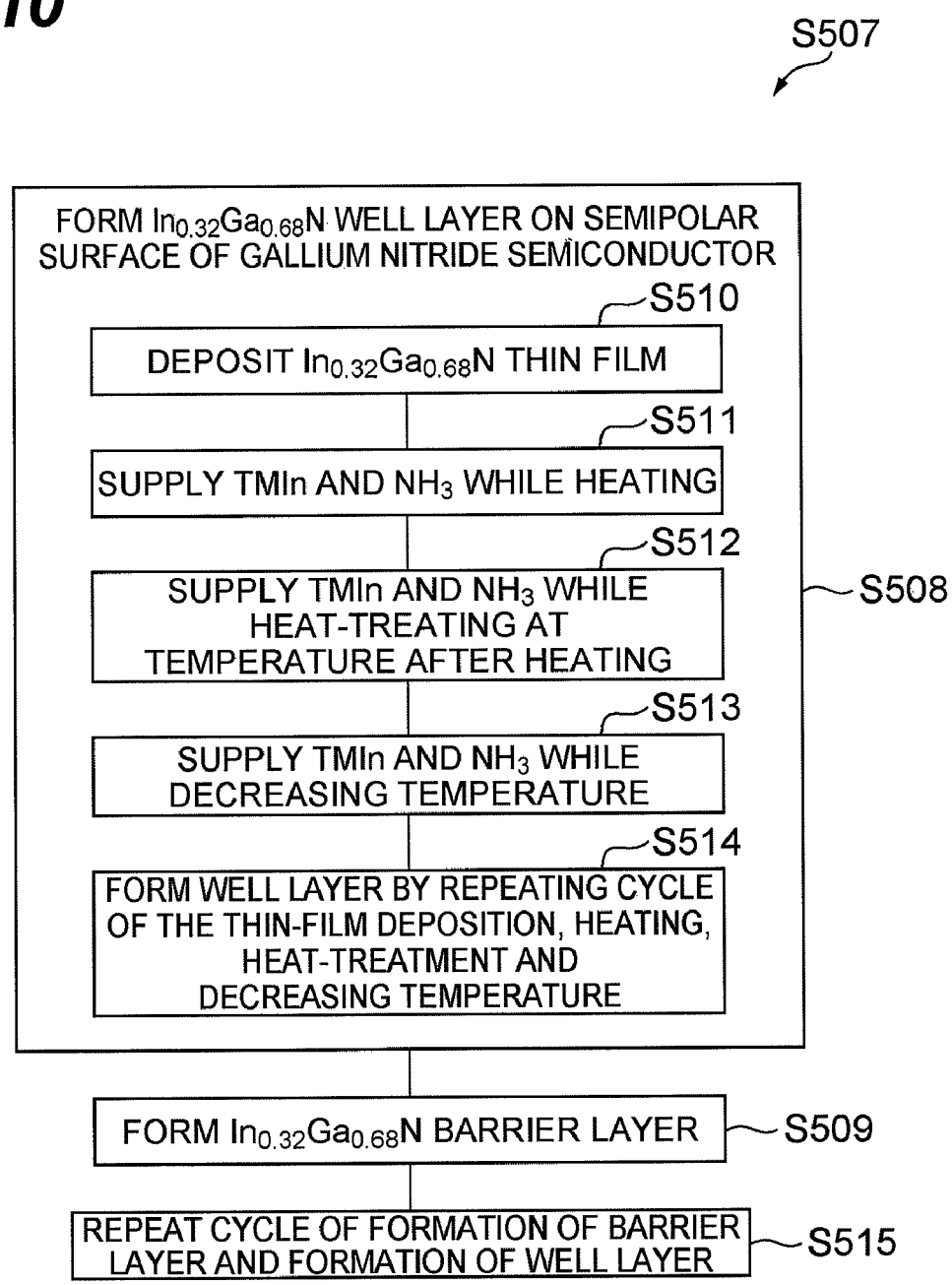
FIG. 10 is a flow chart illustrating the primary steps of making an active layer in Example 4.

A group III nitride semiconductor laser was fabricated on a semipolar surface of a GaN wafer in the manner as described in the embodiments above, with the exception of the formation of an active layer, and the semipolar surface is tilted with reference to the c-plane by 21 degrees toward the direction of a-axis. The growth temperature was changed using an infrared lamp heater of a susceptor. FIG. 10 illustrates the primary steps of forming the active layer of the group III nitride semiconductor laser in Example 4. In Step 507, the active layer was formed. Example 4 is different from Examples 1 to 3 in the following: in Example 4, the InGaN well layer has a thickness of 1.8 nm; and the molar ratio of the indium content is 0.32. First, in Step 510, an $In_{0.32}Ga_{0.68}N$ thin film having a thickness of 1 nm was deposited at 660° C. After the deposition of the thin film, in Step 511, the growth temperature was changed to 850° C. in about ten seconds, while TMIn and $NH_3$ were supplied to the reactor. In Step 512, the growth temperature was kept at 850° C. for about ten seconds. After keeping the temperature, in Step 513, the growth temperature was changed to 660° C. in about 15 seconds, while TMIn and $NH_3$ were supplied to the reactor. In the temperature rise and temperature holding, the ratio $[NH_3]/[TMIn]=10000$ was used. In Step 514, two $In_{0.32}Ga_{0.68}N$ thin layers were grown through one cycle of thin-film growth, temperature rise, heat-treatment, and temperature fall. Consequently, an $In_{0.32}Ga_{0.68}N$ well layer having a thickness of 1.8 nm was deposited. In Step 509, TMG, TMIn and $NH_3$ were supplied to the reactor to grow an $In_{0.06}Ga_{0.94}N$ barrier layer at 820° C. In Step 515, these steps were repeated to form three well layers and four barrier layers alternately arranged.

A PL spectrum of the epitaxial wafer was obtained using excitation laser beam having a wavelength of 405 nm. The peak wavelength of the PL spectrum was 570 nm with a full width at half maximum of 35 nm. By use of m-plane cleavage, a semiconductor laser of a ridge structure was fabricated as described in the embodiments above. The threshold current density $I_{th}$ of the semiconductor laser was 10 kA/cm². The peak wavelength of the semiconductor laser was 510 nm. Since the primary surface of the substrate significantly tilts with reference to a c-plane and the well layer has a small thickness, the primary polarization direction of the laser beam from the semiconductor laser can be directed to the a-axis.

EXAMPLE 5

Figure 11:
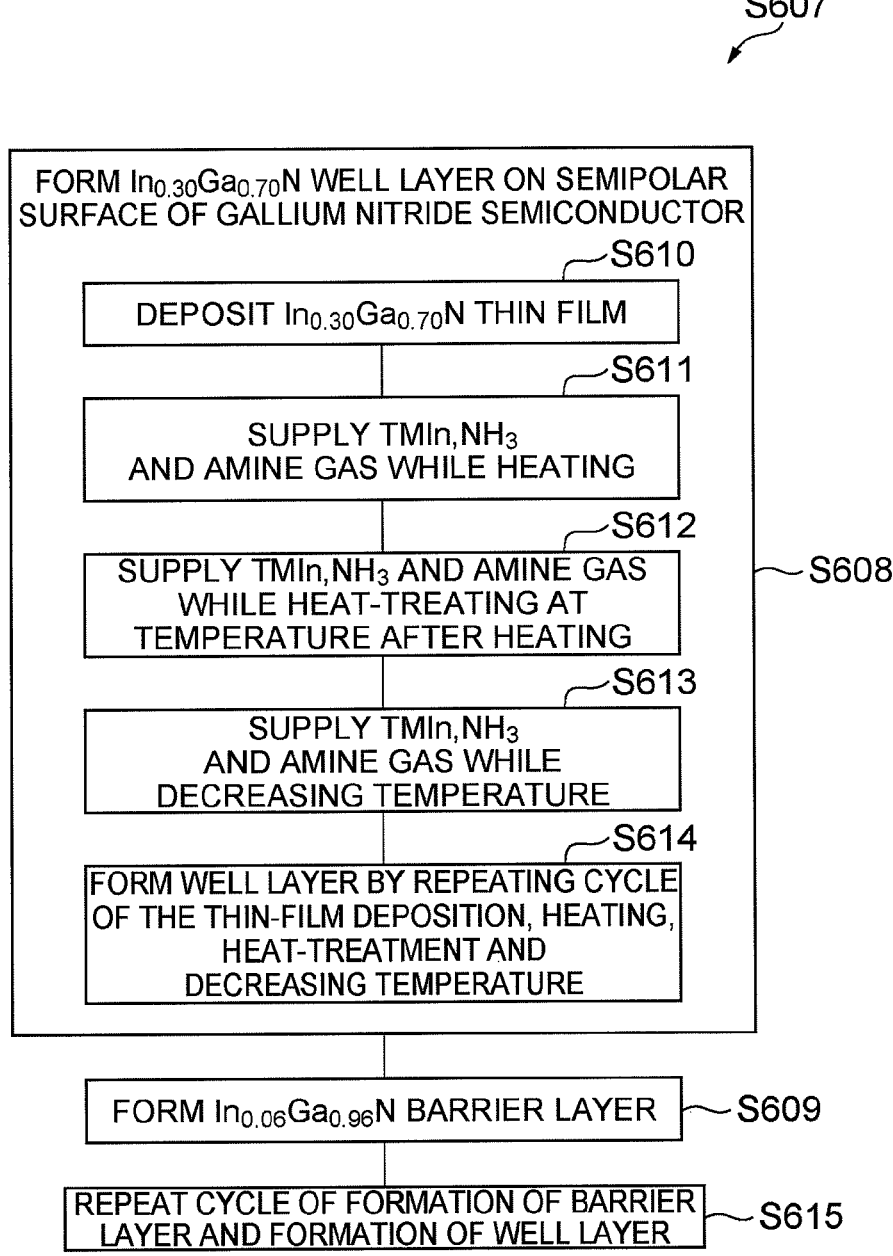
FIG. 11 is a flow chart illustrating the primary steps of making an active layer in Example 5.

A group III nitride semiconductor laser was fabricated on a semipolar surface of a GaN wafer as described in the embodiments above, with the exception of the formation of an active layer, and the semipolar surface is tilted with reference to the c-plane by 21 degrees toward the direction of the a-axis. The growth temperature was changed using an infrared lamp heater of a susceptor. FIG. 11 illustrates the primary steps of forming the active layer of the group III nitride semiconductor laser in Example 5. In Step 607, the active layer was formed. Example 5 is different from Examples 1 to 4 in the use of an amine gas as the nitrogen raw material. Compared with ammonia, the amine gas has higher decomposition efficiency at low temperature. Monomethylamine was used as the amines. Monomethylamine gas was used together with ammonia for the growth of a well layer, and the molar ratio of monomethylamine to ammonia (monomethylamine/ammonia) was 1:10. In consideration of the dissociation equilibrium constant, it is expected that the amine can produce one million times as many active nitrogen ($NH_2$) molecules as those ammonia produces at 500° C.

First, in Step 610, TMG, TMIn, $NH_3$ and monomethylamine were supplied to the reactor to deposit an $In_{0.32}Ga_{0.68}N$ thin film having a thickness of 1 nm at 660° C. After the deposition of this thin film, in Step 611, the growth temperature was changed to 850° C. in about ten seconds, while TMIn, $NH_3$ and monomethylamine were supplied to the reactor. In Step 612, the growth temperature was kept at 850° C. for about ten seconds. After the temperature was kept constant, in Step 613, the growth temperature was changed to 660° C. over about 15 seconds, while TMIn, $NH_3$ and monomethylamine were supplied to the reactor. Through Steps 611 to 613, the ratio [total nitrogen raw material]/[TMIn] of 10000 was used. In Step 614, two $In_{0.32}Ga_{0.68}N$ thin layers were deposited through one cycle of thin film deposition, temperature rise, heat treatment, and temperature fall. Consequently, an $In_{0.32}Ga_{0.68}N$ well layer having a thickness of 1.8 nm was deposited. In Step 609, TMG, TMIn and $NH_3$ were supplied to the reactor to grow an $In_{0.06}Ga_{0.94}N$ barrier layer at 820° C. In Step 615, these steps were repeated to form three well layers and four barrier layers alternately arranged.

A PL spectrum of the epitaxial wafer was measured using excitation laser beam having a wavelength of 405 nm. The peak wavelength of the PL spectrum was 530 nm having a full width at half maximum of 32 nm. By use of m-plane cleavage, a semiconductor laser of a ridge structure was fabricated as described in the embodiments. The threshold current density $I_{th}$ of the semiconductor laser was 7 kA/cm².

In addition to Examples 1 to 5, another group III nitride semiconductor laser was prepared, and this group III nitride semiconductor laser has a well layer in an active layer that was formed through a single deposition process. The group III nitride semiconductor laser was prepared on the c-plane of a GaN wafer as described in the embodiments above, with the exception of the formation of an active layer.

A PL spectrum of the epitaxial wafer was measured using excitation laser beam having a wavelength of 405 nm. The peak wavelength of the PL spectrum was 570 nm having a full width at half maximum of 50 nm. This semiconductor laser structure exhibited no lasing, although the applied current density was increased up to 20 kA/cm$^2$.

Although the InGaN thin films each having a thickness of about 1 nm are used in Examples as explained above, the embodiments of the invention are not limited to such a specific value. Multiple cycles of deposition and reform of the InGaN thin films, each of which has a thickness smaller than a desired thickness of the well layer ensures high homogeneity of the indium distribution in the InGaN layer of a high indium content.

EXAMPLE 6

An indium distribution in an InGaN well layer grown as described in the embodiments above was studied. The composition was analyzed by a transmission electron microscope TEM-EDX. The composition was measured at intervals of 20 nm on the InGaN well layer to obtain one hundred measurement values. The EDX measurement was carried out by point analysis, using the configuration data from an InGaN monolayer film the average composition of which had been preliminarily obtained by X-ray diffractometry. The results show that the maximum and the minimum indium content distributions in the InGaN well layer fall within the range from −15% to +15% of the average, based on the relationship (the maximum content−the minimum content)/(the maximum content+the minimum content). Also, the molar ratio of indium in InGaN semiconductor was determined by the X-ray diffractometry.

A variety of experiments in different ways were carried out by the inventors. These experiments teach the following: laser oscillation is possible when the PL spectrum has a full width at half maximum not exceeding 40 nm in an active layer including an InGaN well layer that is composed of a stack of multiple InGaN thin films; and in the well layer of the active layer capable of laser oscillation, the maximum and the minimum in the indium content distribution in the InGaN well layer resided within the range from −15% to +15% of the average.

At higher growth temperature, the fluctuation (spatial inhomogeneity) in the indium content of an InGaN layer is reduced. On the other hand, at lower growth temperature, a larger amount of indium is more readily taken into InGaN so as to form InGaN of a high indium content. As described above, InGaN is deposited at lower temperature so as to incorporate a larger amount of indium therein, and the fluctuation of the indium content is reduced by heat treatment at higher temperature in an atmosphere containing both indium and nitrogen. In the application of the above step to the InGaN this film can reduce the amount of the fluctuation more remarkably. Accordingly, through the repetitions of the deposition of an InGaN thin film and the heat treatment thereof that improves the homogeneity of the indium content, the InGaN layer of a desired thickness is formed. Both the well layer and the barrier layer, which are composed of a stack of multiple InGaN thin films, have indium contents with smaller fluctuations. Consequently, the full width at half maximum in the PL spectrum of the active layer was improved. For example, the indium content fluctuation of each well layer in an active layer was reduced to about 15%. On the other hand, the indium content fluctuation of an InGaN well layer, which is grown in a single deposition without the repetitions of the deposition and the heat treatment, exceeds 15% and increased up to about 20%.

Especially, a group III nitride semiconductor laser having an peak wavelength of 490 nm or more requires a well layer having a indium molar ratio of 0.24 or more. In the embodiments according to the present invention, the fluctuation of the indium content is small over the entire well layer, because the fluctuation of the indium contents of InGaN thin layers constituting a well layer are reduced individually. As a result, the active layer has a full width at half maximum of the PL spectrum not exceeding 40 nm.

For the laser oscillation of a nitride gallium semiconductor laser, a well layer having a small full width at half maximum of the PL spectrum is required. According to the inventors' findings as described above, the well layer of a high indium content is required to achieve long wavelength lasing. Since such a well layer needs to be grown at low temperature, the fluctuation of the indium content tends to increase. Accordingly, it is not easy to obtain an active layer of a small full width at half maximum of the PL spectrum, as compared with short wavelength gallium nitride based semiconductor lasers. The active layer having a full width at half maximum of the PL spectrum not exceeding 40 nm enables lasing, which was observed at an applied current lower than 20 kA/cm$^2$.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A group III nitride semiconductor laser comprising:
    a GaN substrate having a primary surface;
    a first conductivity type group III nitride semiconductor layer provided on the GaN substrate;
    a second conductivity type of group III nitride semiconductor layer provided on the GaN substrate; and
    an active layer having multiple In$_x$Ga$_{1-x}$N well layers and plural barrier layers, the active layer being provided on the GaN substrate, the active layer being provided between the first conductivity type group III nitride semiconductor layer and the second conductivity type group III nitride semiconductor layer, a molar ratio x of indium of the In$_x$Ga$_{1-x}$N well layer is equal to or more than 0.32 and not more than 0.35, and
    wherein a distribution of indium content in the In$_x$Ga$_{1-x}$N well layers has a maximum and a minimum, and the maximum and the minimum reside within a range from −15% to +15% of an average of the indium content in the well layers, and wherein the average of the indium content indicates the molar ratio x of, and
    wherein each well layer comprises a plurality of In$_x$Ga$_{1-x}$N thin films, the plurality of In$_x$Ga$_{1-x}$N thin films includes one In$_x$Ga$_{1-x}$N thin film and another In$_x$Ga$_{1-x}$N thin film, and the one In$_x$Ga$_{1-x}$N thin film and the other In$_x$Ga$_{1-x}$N thin film forms an interface.

2. The group III nitride semiconductor laser according to claim 1, wherein the plurality of In$_x$Ga$_{1-x}$N thin films have the substantially same average indium content.

3. The group III nitride semiconductor laser according to claim 1, wherein the first conductivity type group III nitride semiconductor layer comprises one of GaN and AlGaN, and the first conductivity type group III nitride semiconductor layer is provided between the GaN substrate and the active layer.

4. The group III nitride semiconductor laser according to claim 1, wherein the active layer is mounted on the primary surface of the GaN substrate, and the primary surface of the GaN substrate includes a polar plane of the hexagonal GaN.

5. The group III nitride semiconductor laser according to claim 1, wherein the active layer is mounted on the primary surface of the GaN substrate, and the primary surface of the GaN substrate includes a nonpolar plane of the hexagonal GaN.

6. The group III nitride semiconductor laser according to claim 1, wherein the active layer is mounted on the primary surface of the GaN substrate, and the primary surface of the GaN substrate includes a semipolar plane of the hexagonal GaN.

7. The group III nitride semiconductor laser according to claim 1, wherein the second conductivity type group III nitride semiconductor layer comprises one of GaN and AlGaN, and the first conductivity type group III nitride semiconductor layer is provided between the GaN substrate and the active layer.

8. The group III nitride semiconductor laser according to claim 1, wherein the active layer includes a barrier layer of InGaN.

9. The group III nitride semiconductor laser according to claim 1, wherein a laser emission wavelength of the group III nitride semiconductor laser is equal to or longer than 490 nm.

10. The group III nitride semiconductor laser according to claim 1, further comprising an optical guide layer provided between the first conductivity type group III nitride semiconductor layer and the active layer, and the optical guide layer comprises GaN.

11. The group III nitride semiconductor laser according to claim 1, further comprising an optical guide layer provided between the second conductivity type group III nitride semiconductor layer and the active layer, and the optical guide layer comprises InGaN.

12. The group III nitride semiconductor laser according to claim 1, wherein the active layer includes a barrier layer, and the barrier layer comprises a plurality of $In_yGa_{1-y}N$ thin films, and the plurality of $In_yGa_{1-y}N$ thin films have the substantially same average indium content.

13. The group III nitride semiconductor laser according to claim 12, wherein the plurality of $In_yGa_{1-y}N$ thin films includes one $In_yGa_{1-y}N$ thin film and another $In_yGa_{1-y}N$ thin film, and the one $In_yGa_{1-y}N$ thin film and the another $In_yGa_{1-y}N$ thin film forms an interface.

14. The group III nitride semiconductor laser according to claim 1, wherein the first conductivity type group III nitride semiconductor layer comprises a cladding layer, and the cladding layer comprises group III nitride semiconductor including aluminum as group III element.

* * * * *